United States Patent [19]

Weinzierl

[11] Patent Number: 4,849,715
[45] Date of Patent: Jul. 18, 1989

[54] INCREMENTALLY TUNED PHASE LOCKED LOOP FREQUENCY SYNTHESIZER

[75] Inventor: Franz Weinzierl, Crailsheim, Fed. Rep. of Germany

[73] Assignee: Firma Wegmann & Co. GmbH, Kassel, Fed. Rep. of Germany

[21] Appl. No.: 209,752

[22] Filed: Jun. 21, 1988

[30] Foreign Application Priority Data

Jun. 26, 1987 [DE] Fed. Rep. of Germany ....... 3721154

[51] Int. Cl.$^4$ .............................................. H03L 7/18
[52] U.S. Cl. ....................................... 331/10; 331/16; 331/25
[58] Field of Search .................. 331/4, 10, 11, 16, 25, 331/1 A

[56] References Cited

U.S. PATENT DOCUMENTS 4,290,029 9/1981 Streckenbach ..................... 331/1 A
4,516,083 5/1985 Turney ............................... 331/4 X

*Primary Examiner*—Siegfried H. Grimm
*Attorney, Agent, or Firm*—Sprung Horn Kramer & Woods

[57] ABSTRACT

A frequency synthesizer with a voltage-controlled oscillator that can be tuned over its total frequency range in increments of a prescribed frequency range a frequency-dictating component. A reference oscillator emits a reference signal of a strictly prescribed frequency that is supplied as a first input signal to a comparator to which is simultaneously supplied a second input signal of a frequency that is a function of the frequency of the output signal from the voltage-controlled oscillator. The comparator generates a fine-tuning signal in accordance with the difference between the frequencies or between the phases of the first and second input signals and supplies the fine-tuning signal to the voltage-controlled oscillator. The second input signal supplied to the comparator is generated by a variable frequency divider that is adjusted by means of a variable electronic setting component to which the fine-tuning signal is supplied and which continues to vary the dividing factor of the frequency divider until the voltage of the fine-tuning signal assumes a defined level within a prescribed range of voltages that fine-tunes the frequency of the output signal from the voltage-controlled oscillator, whereby the frequency of the output signal is within the subsidiary frequency range set at the frequency-dictating component.

8 Claims, 2 Drawing Sheets

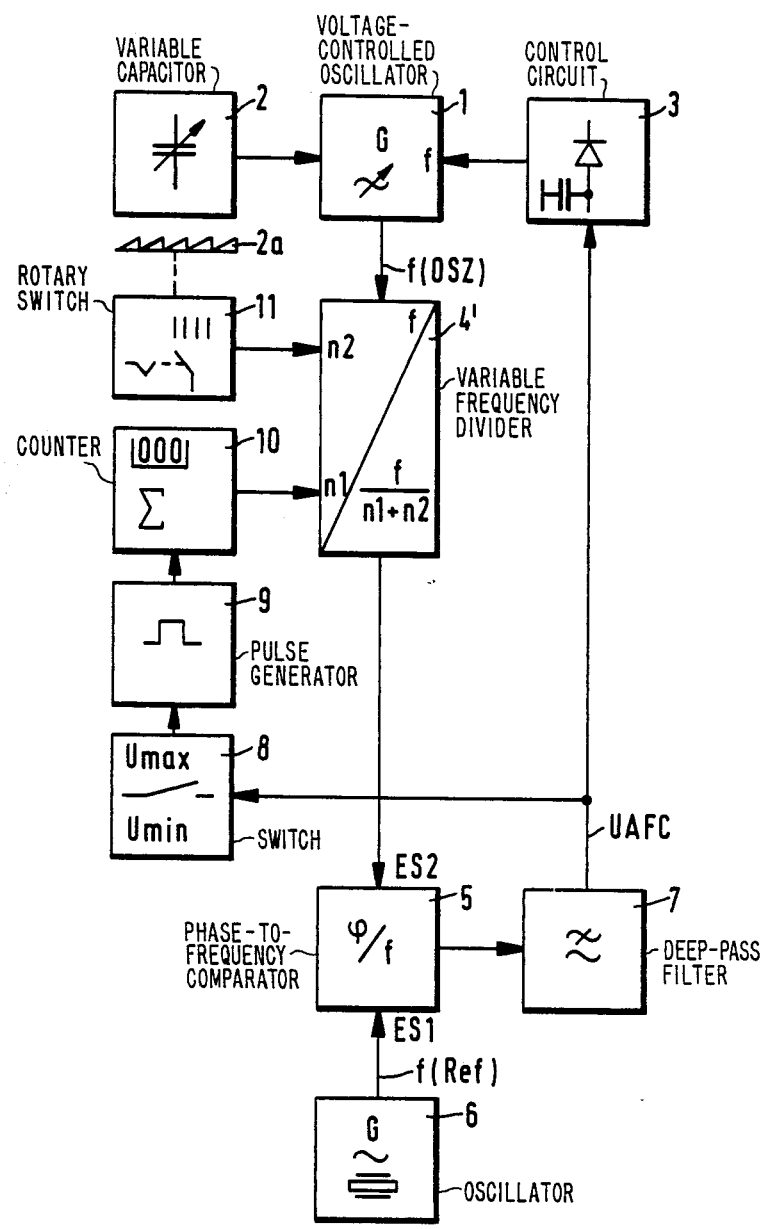

INCREMENTALLY TUNED PHASE LOCKED LOOP FREQUENCY SYNTHESIZER

BACKGROUND OF THE INVENTION

The object of the invention is a frequency synthesizer with a voltage-controlled oscillator that can be tuned over its total frequency range in increments of a prescribed frequency range by means of a frequency-dictating component and with a reference oscillator that emits a reference signal of a strictly prescribed frequency that is supplied in the form of an input signal to a comparator, to which is simultaneously supplied another input signal of a frequency that is a function of the frequency of the output signal from the voltage-controlled oscillator, the second input signal generating a fine-tuning signal in accordance with the difference between the frequencies or between the phases of the first and second input signals and the fine-tuning signal supplied to the voltage-controlled oscillator to fine-tune the frequency of its output signal to the level defined by the reference signal.

Various embodiments of frequency synthesizers of this type are known. The reference oscillator is generally a quartz oscillator that supplies a reference signal having an extremely stable frequency.

The second input signal, which is supplied to the comparator and which has a frequency that is supposed to be a function of the frequency of the output signal, can usually be generated due to the presence of at least one other reference oscillator, which can for example be a spectrum generator with an output signal that contains discrete values of a prescribed frequency spectrum. The output signal from the second reference oscillator is mixed with the output signal from the voltage-controlled oscillator and the output signal from the mixer is supplied by way of an appropriate band-pass filter to the comparator, wherein a signal with a frequency that is either the sum of or the difference between the frequency of the output signal from the voltage-controlled oscillator and the frequency of a signal with one of the frequencies of the second reference oscillator, is compared to the output signal from the first reference oscillator. The accordingly generated channel grid of signals corresponds to the interval between the spectral lines of the second reference oscillator. If this interval is for example 1 MHz, the output signal from the voltage-controlled oscillator can be stabilized at frequencies 1 MHz apart. The voltage-controlled oscillator is usually fine-tuned by supplying the fine-tuning signal emitted by the comparator by way of a loop filter that suppresses control oscillations to a capacitive diode that controls the voltage-controlled oscillator. The frequency synthesizer can be tuned at the variable capacitor to approximately the desired frequency and will accordingly lock into one of the prescribed frequencies, becoming tuned to the precision of the reference frequency.

If the frequency grid generated in this way seems to be too coarse, a third oscillator can be employed. The third oscillator can be a local oscillator with a frequency in the vicinity of switchable quartz crystals and with an output signal that can be mixed in another mixer with the signal generated from the signals from the voltage-controlled oscillator and from the spectrum generator, creating a fine-frequency grid.

A frequency grid with intervals of 25 kHz can be created in this way in the frequency range of 40 to 50 MHz for example for the output signal from the voltage-controlled oscillator, with the adjusted frequencies having a precision of approximately 2 to 3 kHz.

One drawback of this known frequency synthesizer is its expensive and complicated design, involving several reference oscillators and a series of circuitry measures to suppress disruptive subsidiary frequencies. One advantage of the known embodiments is that the coarse tuning is carried out with a low-loss variable capacitor and only the fine tuning is carried out by means of a high-loss fine-tuning diode, which is noisy by its very nature.

Also known is a frequency synthesizer that avoids the high circuitry expenditure of the aforesaid embodiment by supplying the output signal from the voltage-controlled oscillator to a variable frequency divider with a dividing factor that ensures that its output signal will be in the frequency range of the reference signal. The fine-tuning signal obtained from the comparator is supplied in this embodiment as well to a capacitive diode for tuning the voltage-controlled oscillator. This embodiment lacks a variable capacitor for coarse tuning, and the output frequency is dictated strictly by setting the dividing factor at the variable frequency divider.

A frequency synthesizer of this type is inexpensive to construct, and its frequency constancy depends on only a single reference oscillator. Its essential drawback is that, since a capacitive diode is employed for all the tuning, a considerable amount of noise must be put up with.

SUMMARY OF THE INVENTION

The object of the present invention is to create a frequency synthesizer with the aforesaid characteristics that can be manufactured at very little circuitry expenditure and in particular includes only a single reference oscillator while supplying an extremely low-noise output signal.

This object is attained in accordance with the invention by the improvement wherein the second input signal supplied to the comparator is generated by a variable frequency divider that is adjusted by means of a variable electronic setting component, to which the fine-tuning signal is supplied and which continues to vary the dividing factor of the frequency divider until the voltage of the fine-tuning signal assumes a defined level within a prescribed range of voltages that fine-tunes the frequency of the output signal from the voltage-controlled oscillator to the frequency of the second input signal multiplied by the dividing factor so obtained, whereby the frequency of the output signal is within the subsidiary frequency range prescribed by the grid and set at the frequency-dictating component.

It has turned out to be practical for the electronic setting component to have a counter that is activated by a pulse generator, whereby the pulse generator is turned on and off by a switching device to which the fine-tuning signal is supplied and which keeps the pulse generator turned on until the voltage of the fine-tuning signal attains a level between a prescribed maximum and a prescribed minimum and then turns it off, whereby, once the pulse generator has been turned off, the frequency-division ratio determined by the electronic setting component will remain constant.

The counter can count either in only one direction or in both directions.

The dividing factor of the frequency divider in one practical embodiment can be varied at subsidiary increments greater than 1 by the electronic setting component and the values of the dividing factor that are between these subsidiary increments can be established by a mechanical switch to fine-tune the output frequency of the voltage-controlled oscillator.

The mechanical switch can be mechanically coupled to the incremental system of the frequency-dictating component in such a way that the latter will, when the mechanical switch is activated, be entrained to an extent that equals the prescribed change in frequency.

The theory behind the invention is that the frequency-division ratio is not strictly prescribed at the frequency divider, and it is only a setting that is prescribed at the frequency-dictating component, in consequence of which the electronic setting component automatically selects and establishes the dividing factor. The result is actually a control loop wherein the parameter that is to be controlled is a frequency-dividing factor.

The variable frequency-dictating component can be either a variable capacitor or a variometer.

As will be disclosed later herein with reference to one embodiment, the frequency synthesizer in accordance with the invention is inexpensive to manufacture and supplies an extremely low-noise output signal with a very high frequency precision.

Another advantage of the frequency synthesizer in accordance with the invention is that the potential for adjustment in terms of frequency selection, specifically coarse adjustment by activating the variable capacitor plus the potential for fine adjustment by means of a variable switch, is retained unchanged in relation to the known and initially mentioned frequency synthesizer. The external design and mode of operation of specific equipment that has already been supplied to consumers can accordingly be retained. The frequency synthesizer in accordance with the invention is accordingly especially practical for the updating of known equipment that is already provided with a variable capacitor.

Two embodiments of a frequency synthesizer in accordance with the invention will now be specified with reference to the drawings wherein:

BRIEF DESCRIPTION OF THE DRAWINGS

FIG. 2 is a variation of the frequency synthesizer illustrated in FIG. 1 with the added capability of fine-adjusting the frequency with a switch.

DETAILED DESCRIPTION OF THE INVENTION

Figure 1:
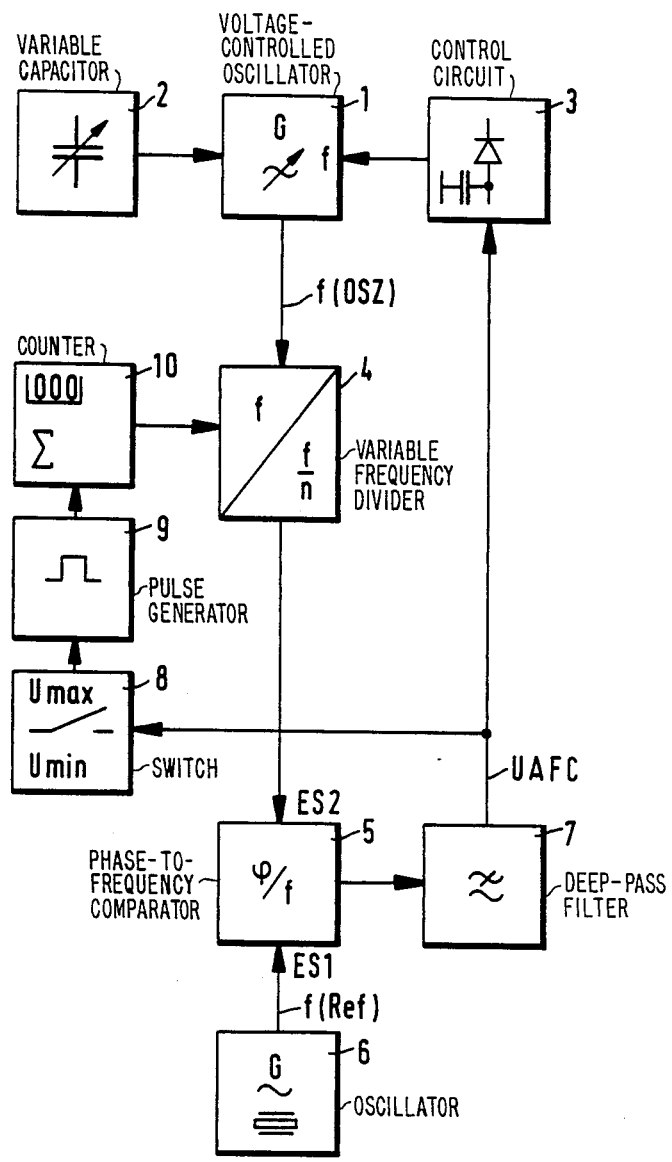
FIG. 1 is a block diagram of a frequency synthesizer wherein the frequency is coarse-adjusted by means of a variable capacitor.

The frequency synthesizer illustrated in FIG. 1 has a voltage-controlled oscillator 1 with an output frequency that can be coarsely adjusted by means of a manually operated variable capacitor 2 and in the fine-tuning range by means of a control circuit 3 that includes a capacitive diode.

The output signal, with a frequency f (OSZ), from voltage-controlled oscillator 1 is supplied to a variable frequency divider 4. The output signal from divider 4 is supplied in the form of an input signal ES2 to a phase-to-frequency comparator 5. Also supplied to comparator 5 in the form of an input signal ES1 is the output signal of a quartz-controlled reference oscillator 6 with a frequency f (Ref).

Comparator 5 generates a fine-tuning signal UAFC that is supplied to control circuit 3 by way of a low-pass filter 7 that prevents control fluctuations.

Frequency divider 4 is set by an electronic setting component that includes a counter 10 activated by a pulse generator 9. Pulse generator 9 is turned on and off by a switching device 8 in accordance with the value of the fine-tuning signal UAFC supplied to the switching device. Comparator 5 is designed such that, when the frequencies of its two input signals ES1 and ES2 are so far apart that the prescribed fine-tuning range is exceeded, it emits a fine-tuning signal with a maximum voltage Umax or a minimum voltage Umin. Pulse generator 9 is always turned on when the voltage detected at switching device 8 has the value Umax or Umin and is turned off as soon as the voltage of the fine-tuning signal is between those two limits.

How the frequency synthesizer illustrated in FIG. 1 operates will now be described.

The frequency of the output signal from the voltage-controlled oscillator 1 is coarsely adjusted at variable capacitor 2. The frequency of the output signal from frequency divider 4 is initially very different from the frequency f (Ref) of reference oscillator 6, meaning that fine-tuning signal UAFC has voltage Umax or Umin. This means that counter 10 will count and simultaneously vary the dividing factor n of frequency divider 4 until, due to the corresponding change in frequency at the input signal ES2 of comparator 5, the voltage of fine-tuning signal UAFC will be between the levels Umin and Umax for a specific n. The frequency of the output signal of the voltage-controlled oscillator will remain constant during this procedure until a dividing factor n is attained, at which time the voltage UAFC changes from one extreme to the other. At this instant the system will lock in and the frequency of the output signal at voltage-controlled oscillator 1 will be fine-tuned to a level that equals the product of the frequency f (Ref) of the reference oscillator and the established dividing factor n.

If, for example, frequency f (Ref) is 1 MHz and f (OSZ) is coarsely adjusted by variable capacitor 2 (OSZ) to 53.1 MHz, counter 10 will count backward to n=53, and the output signal will lock onto a frequency f (OSZ) of 53 MHz.

If the variable capacitor is adjusted on the basis of a coarse grid of ±500 kHz, the frequency fine-tuning range Umax to Umin must be narrower, ±300 kHz for example, because otherwise the system might erroneously lock in at an interval of ±1 MHz. Variable capacitor 2 must accordingly adjust the freely oscillating frequency f (OSZ) of the output signal as precisely as possible to the desired rated frequency, at for instance a maximum tolerance of approximately ±150 kHz.

FIG. 2 illustrates a variant of the frequency synthesizer illustrated in FIG. 1 that makes it possible to attain a finer frequency grid for the output signal of voltage-controlled oscillator 1.

This is attained by breaking down the target dividing factor into the sum of two dividing factors such that $n=n1+n2$. Summand n1 is as before dictated by the state of counter 10, whereas summand n2 is obtained by adjusting an additional rotary switch 11 with several positions. This makes it possible to attain as fine a grid as desired without having to travel through all the division steps in adjusting and fine-tuning the circuitry of counter 10.

The procedure will now be described with reference to an example of counting.

Assume that the frequency f (Ref) of the reference signal from reference oscillator 6 is 25 kHz.

The frequency at variable capacitor 2 can be varied at increments of 1 MHz.

If, for example, an output signal with a value f (OSZ)=43.575 MHz is obtained, that value will be broken down into 43.575 MHz=43 MHz+575 kHz.

The two summands of the dividing factors will be
n1=43 000/25=1720, set at counter 10, and
n2=575/25=23, set at rotary switch 11.
This results in a total dividing factor of n=1743.

Counter 10 will now count cyclically in one or both directions until it arrives at a dividing factor n1=1720, advancing 40 units at each increment for a dividing factor with a frequency of 1 MHz. The system will lock in at n1=1720, which corresponds to a total n=1743.

If the frequency is to be increased 1 MHz, variable capacitor 2 will advance one increment of incremental system 2a to the value f (OSZ)=44.575 MHz.

The summands of the dividing factor n are now broken down into
n1=44,000/25=1760 and
n2=575/25=23.
This results in a total dividing factor of n=n1+n2=1783.

If the fine grid is to be changed, by rotary switch 11 advancing to a channel that corresponds to an output frequency of 25 kHz for example, then
f(OSZ)=44.600 MHz,
n1=44,000/25=1760 and
n2=600/25=24.
The sum will be n1+n2=1784.

To prevent incorrect locking-in and to attain a setting for the rated frequency that is as precise as possible, the incremental system 2a of variable capacitor 2 is mechanically connected to rotary switch 11 by way of an appropriate transmission, so that the variable capacitor will be correspondingly entrained when the switch is activated.

The frequency precision at which the output signal can be adjusted is extraordinarily high, equalling that of the reference frequency. It has been demonstrated that it is possible to attain an output-signal precision of 35 ppm in the range described by way of example. This corresponds to a frequency tolerance of ±1.75 kHz, equal in all channels.

It will be appreciated that the instant specifications and claims are set forth by way of illustration and not limitation, and that various modifications and changes may be made without departing from the spirit and scope of the present invention.

What is claimed is:

1. In a frequency synthesizer with a voltage-controlled oscillator for producing an output signal, means for tuning the oscillator over its total frequency range in increments of a prescribed frequency range including a frequency-dictating component, a reference oscillator that emits a reference signal of a strictly prescribed frequency, means receptive of the output signal from the voltage-controlled oscillator for producing a second signal having a frequency that is a function of the frequency of the output signal from the voltage-controlled oscillator, comparator means receptive of the reference signal and the second signal for generating a fine-tuning signal in accordance with the difference between the frequencies or between the phases of the reference and second input signals and applying the fine-tuning signal to the voltage-controlled oscillator to fine-tune the frequency of its output signal to the level defined by the reference signal, the improvement wherein the means for producing the second signal comprises a variable frequency divider, a variable electronic setting component receptive of the fine-tuning signal for varying the dividing factor of the frequency divider until the voltage of the fine-tuning signal is at a defined level within a prescribed range of voltages that fine-tunes the frequency of the output signal from the voltage-controlled oscillator to the frequency of the second signal multiplied by the dividing factor so obtained, whereby the frequency of the output signal is within a subsidiary frequency range prescribed by a grid and set at the frequency-dictating component.

2. The frequency synthesizer as in claim 1, wherein the electronic setting component comprises a counter activated by a pulse generator, a switching device receptive of the fine-tuning signal for turning the pulse generator on until the voltage of the fine-tuning signal attains a level between a prescribed maximum and a prescribed minimum and then turns it off, so that the frequency-division ratio determined by the electronic setting component will remain constant.

3. The frequency synthesizer as in claim 2, wherein the counter counts in only one direction.

4. The frequency synthesizer as in claim 2, wherein the counter counts in both directions.

5. The frequency synthesizer as in claim 1, further comprising means for varying the dividing factor of the frequency divider at subsidiary increments greater than 1 by the electronic setting component and mechanical switching means for establishing values of the dividing factor that are between the subsidiary increments to fine-tune the output frequency of the voltage-controlled oscillator.

6. The frequency synthesizer as in claim 5, wherein the frequency-dictating component includes an incremental system and the mechanical switching means is mechanically coupled to the incremental system of the frequency-dictating component to be entrained to an extent that equals the prescribed change in frequency when the mechanical switching means is activated.

7. The frequency synthesizer as in claim 1, wherein the variable frequency-dictating component is a variable capacitor.

8. The frequency synthesizer as in claim 1, wherein the variable frequency-dictating component is a variometer.

* * * * *